United States Patent
Li et al.

(10) Patent No.: US 11,245,011 B2
(45) Date of Patent: Feb. 8, 2022

(54) VERTICAL TUNNEL FIELD-EFFECT TRANSISTOR WITH U-SHAPED GATE AND BAND ALIGNER

(71) Applicants: Taiwan Semiconductor Manufacturing Co., Ltd., Hsinchu (TW); National Taiwan University, Taipei (TW)

(72) Inventors: Jiun-Yun Li, Taipei (TW); Pao-Chuan Shih, Taichug (TW); Wei-Chih Hou, Taichung (TW)

(73) Assignees: Taiwan Semiconductor Manufacturing Co., Ltd., Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 16/141,383

(22) Filed: Sep. 25, 2018

(65) Prior Publication Data

US 2020/0098867 A1     Mar. 26, 2020

(51) Int. Cl.
| | |
|---|---|
| *H01L 29/10* | (2006.01) |
| *H01L 29/78* | (2006.01) |
| *H01L 29/20* | (2006.01) |
| *H01L 29/73* | (2006.01) |
| *H01L 29/66* | (2006.01) |
| *H01L 29/423* | (2006.01) |

(52) U.S. Cl.
CPC ...... *H01L 29/1054* (2013.01); *H01L 29/2003* (2013.01); *H01L 29/42364* (2013.01); *H01L 29/66446* (2013.01); *H01L 29/7311* (2013.01); *H01L 29/7827* (2013.01); *H01L 29/7831* (2013.01)

(58) Field of Classification Search
CPC ............. H01L 29/1054; H01L 29/2003; H01L 29/7827; H01L 29/7831; H01L 29/7311

USPC ................................. 257/105, 266, 330, 331
See application file for complete search history.

(56) References Cited

U.S. PATENT DOCUMENTS

| | | | |
|---|---|---|---|
| 4,823,171 A | * | 4/1989 | Matsui .................. H01L 29/155 257/24 |
| 9,236,267 B2 | | 1/2016 | De et al. |
| 9,502,265 B1 | | 11/2016 | Jiang et al. |
| 9,520,466 B2 | | 12/2016 | Holland et al. |
| 9,520,482 B1 | | 12/2016 | Chang et al. |

(Continued)

OTHER PUBLICATIONS

Avci et al., "Energy Efficiency Comparison of Nanowire Heterojunction TFET and Si MOSFET at Lg=13nm, Including P-TFET and Variation Considerations," *IEEE International Electron Devices Meeting*, Dec. 9-11, 2013, Washington, DC, pp. 33.4.1-33.4.4.

Avci et al., "Heterojunction TFET Scaling and Resonant-TFET for Steep Subthreshold Slope at sub-9nm Gate-Length," *IEEE International Electron Devices Meeting*, Dec. 9-11, 2013, Washington, DC, pp. 4.3.1-4.3.4.

Li et al., "AlGaSb/InAs Tunnel Field-Effect Transistor With On-Current of 78 µA/µm at 0.5 V," *IEEE Electron Device Letters* 33(3):363-365, 2012.

(Continued)

*Primary Examiner* — Robert T Huber
(74) *Attorney, Agent, or Firm* — Seed IP Law Group LLP

(57) ABSTRACT

The current disclosure describes a new vertical tunnel field-effect transistor (TFET). The TFET includes a source layer over a substrate. A first channel layer is formed over the source layer. A drain layer is stacked over the first channel layer with a second channel layer stacked therebetween. The drain layer and the second channel layer overlap a first surface portion of the first channel layer. A gate structure is positioned over the channel layer by a second surface portion of the channel layer and contacts a sidewall of the second channel layer.

15 Claims, 18 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 10,147,795 B1 * | 12/2018 | Liu | H01L 29/66666 |
| 2017/0365712 A1 * | 12/2017 | Bu | H01L 29/7827 |

OTHER PUBLICATIONS

Shih et al., "A U-Gate InGaAs/GaAsSb Heterojunction TFET of Tunneling Normal to the Gate With Separate Control Over ON- and OFF-State Current," *IEEE Electron Device Letters* 38(12):1751-1754, 2017.

Wang et al., "Design of U-Shape Channel Tunnel FETs With SiGe Source Regions," *IEEE Transactions on Electron Devices* 61(1):193-197, 2014.

Wang et al., "High Mobility Pentacene/$C_{60}$-Based Ambipolar OTFTs by Thickness Optimization of Bottom Pentacene Layer," *IEEE Transactions on Electron Devices* 61(11):3845-3851, 2014.

Wang et al., "$MoO_3$ Modification Layer to Enhance Performance of Pentacene-OTFTs With Various Low-Cost Metals as Source/Drain Electrodes," *IEEE Transactions on Electron Devices* 61(10):3507-3512, 2014.

Zhou et al., "Novel gate-recessed vertical InAs/GaSb TFETs with record high $I_{ON}$ of 180 µA/µm at $V_{DS}$ = 0.5 V," *IEEE International Electron Devices Meeting*, Dec. 10-13, 2012, San Francisco, CA, pp. 32.6.1-32.6.4.

\* cited by examiner

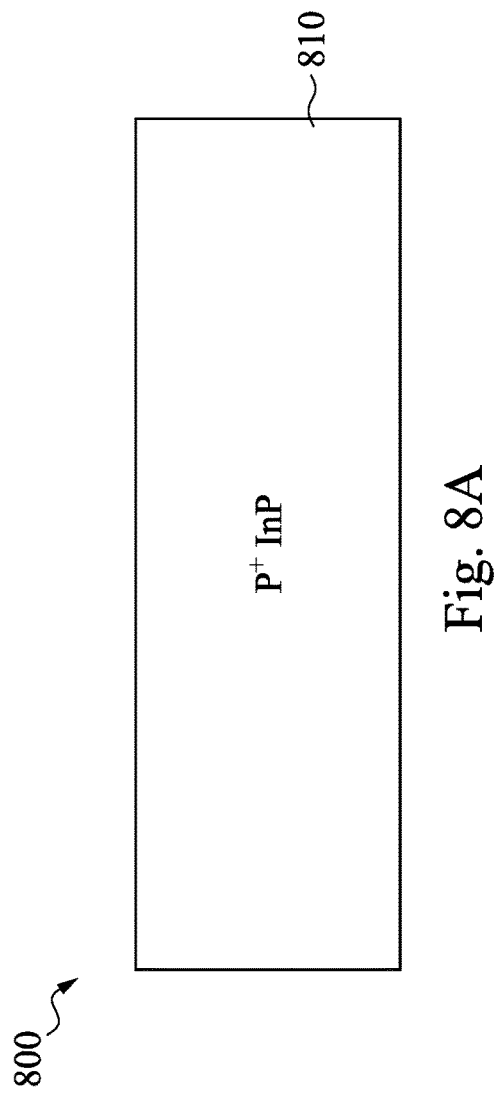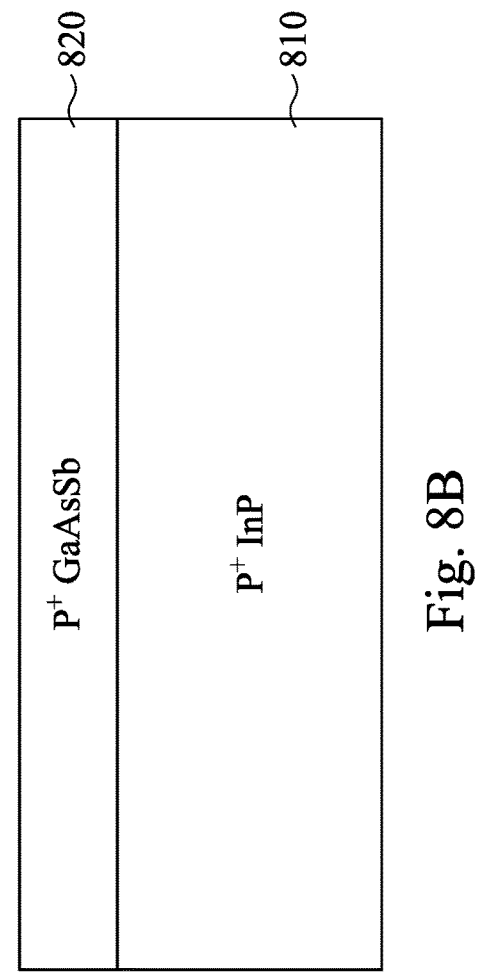
Fig. 8A
Fig. 8B

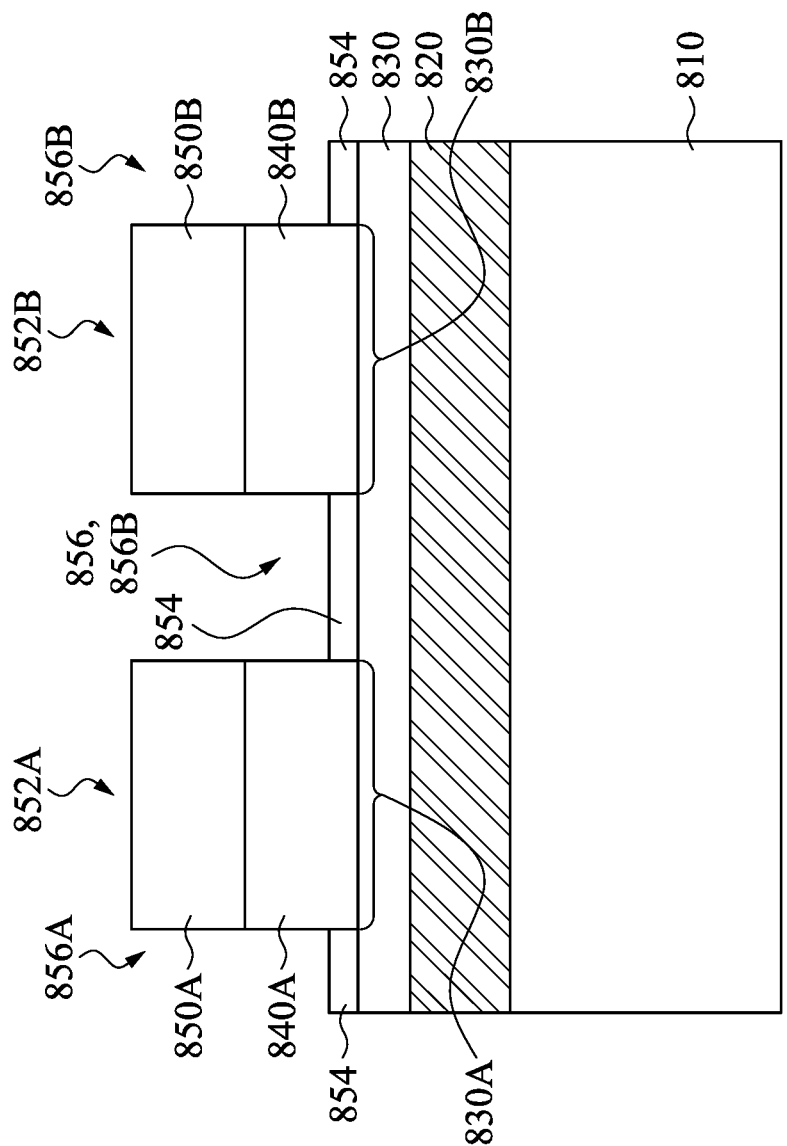
Fig. 8F(1)

900A

| P⁺Ge (Drain) | |
|---|---|
| UID Ge (Interlayer) | UID Ge (Interlayer) |
| UID GeSn/Ge (Channel) | |
| N⁺ GeSn/Ge (Source) | |
| N Ge (Buffer) | |
| N Si (Substrate) | |

900B

| P⁺Si (Drain) | |
|---|---|
| UID Si (Interlayer) | UID Si (Interlayer) |
| UID SiGe (Channel) | |
| P⁺ SiGe (Source) | |
| P SiGe (Buffer) | |
| P⁺ Si (Substrate) | |

900C

| P⁺GaN (Drain) | |
|---|---|
| UID GaN/InGaN (Interlayer) | UID GaN/InGaN (Interlayer) |
| UID InN (Channel) | |
| P⁺ InN/InGaN (Source) | |
| P GaN (Buffer) | |
| P Si (Substrate) | |

Fig. 9

VERTICAL TUNNEL FIELD-EFFECT TRANSISTOR WITH U-SHAPED GATE AND BAND ALIGNER

BACKGROUND

Metal-oxide-semiconductor ("MOS") field-effect transistor ("FET") has been a dominating technology for integrated circuits. A MOSFET can work in three regions, depending on gate voltage $V_g$ and source-drain voltage $V_{ds}$, linear, saturation, and sub-threshold regions. The sub-threshold region is a region wherein gate voltage $V_g$ is smaller than threshold voltage $V_t$. The sub-threshold swing represents the easiness of switching the transistor current off and is an important factor in determining the speed and power of a MOS device. The sub-threshold swing can be expressed as a function of m*kT/q, wherein m is a parameter related to capacitance. The sub-threshold swing of conventional MOS devices has a limit of about 60 mV/decade (kT/q) at room temperature which, in turn, sets a limit for further scaling of operation voltage VDD and threshold voltage $V_t$. This limitation is due to the drift-diffusion transport mechanism of carriers. For this reason, existing MOS devices typically cannot switch faster than 60 mV/decade at room temperatures. The 60 mV/decade sub-threshold swing limit also applies to FinFET or ultra-thin body MOSFET on silicon-on-insulator ("SOI") devices. Therefore, with better gate control over the channel, a newer ultra-thin body MOSFET on SOI or a finFET can achieve a sub-threshold swing close to, but not below, the limit of 60 mV/decade. With such a limitation, faster switching at low operation voltages for future nanometer devices is challenging to achieve.

The tunnel field-effect transistor ("TFET") is a newer type of transistor. TFETs switch by modulating quantum tunneling through a barrier. Because of this, TFETs are not limited by the thermal Maxwell-Boltzmann tail of carriers, which limits MOSFET subthreshold swing to about 60 mV/decade of current at room temperature.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 8A-8H illustrate various views of an example wafer at various stages of fabrication according to embodiments of the disclosure; and FIG. 9 illustrates alternative embodiments of material combinations of the tunnel FET structures according to embodiments of the disclosure.

DETAILED DESCRIPTION

Figure 1A:
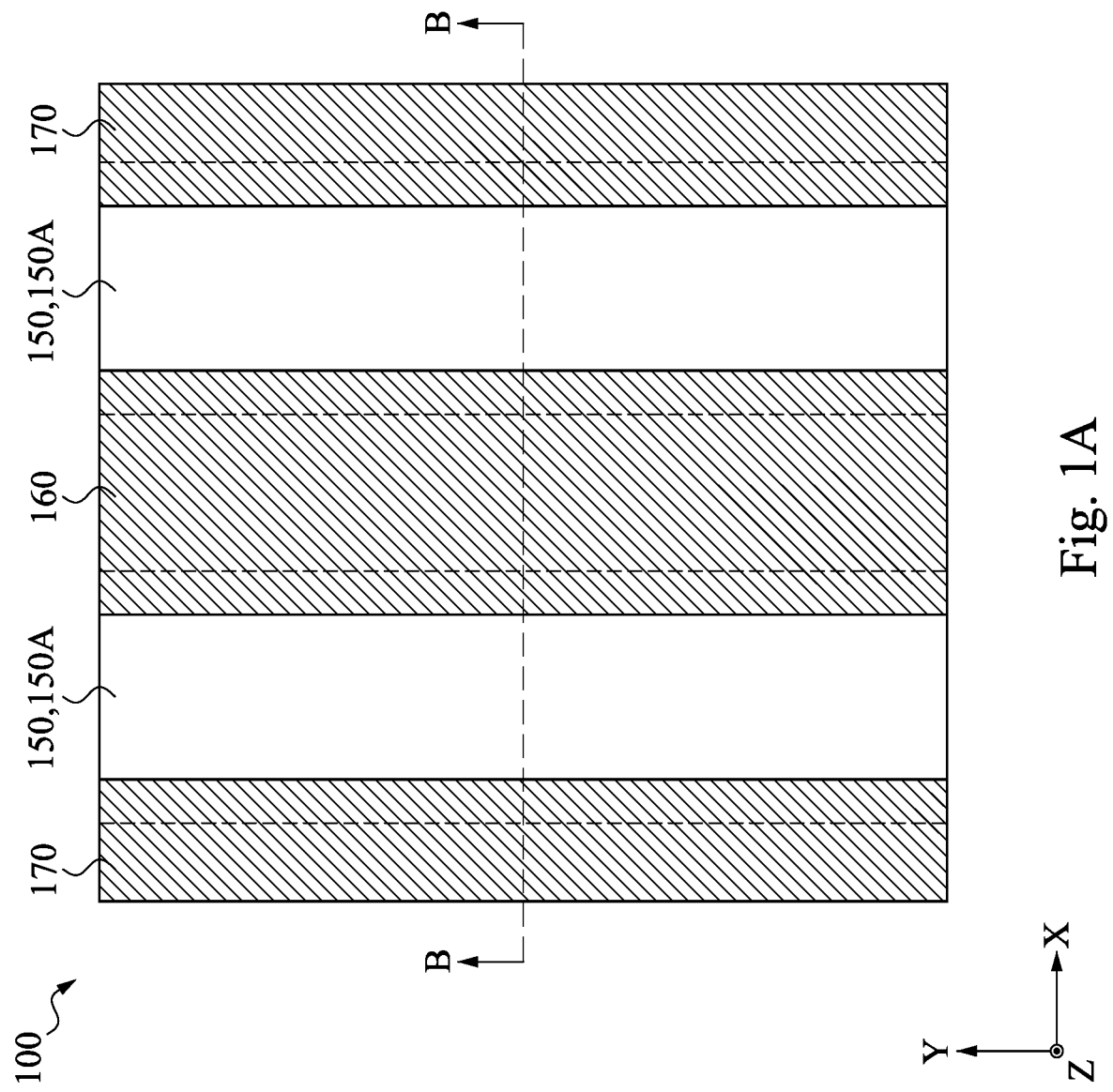
FIGS. 1A and 1B illustrate a top view and a cross-sectional view, respectively, of an example tunnel FET according to embodiments of the disclosure.

Techniques in accordance with embodiments described herein are directed to new vertical tunnel field-effect transistors ("TFET") with III-V compound semiconductor materials "III-V materials". In one or more embodiments of the current disclosure, a source layer of a first III-V material is stacked over a substrate. A channel layer of a second III-V material is stacked over the source layer. A drain layer is stacked over the channel layer ("first channel layer") with an interlayer ("second channel layer") stacked therebetween. The drain layer and the interlayer overlap a first surface portion of the channel layer. A first gate structure is positioned over the channel layer by a second surface portion of the channel layer. The second surface portion is adjacent to and separated from the first surface portion. The first gate structure is also adjacent to the interlayer layer by a first sidewall of the interlayer layer. The first gate structure may also be adjacent to the drain layer by a first sidewall of the drain layer. That is, the first gate structure is substantially "L-shaped" with respect to the interlayer and the channel layer. In an embodiment where two drain layers are coupled to a same source layer and a same channel layer, the first gate structure is substantially "U-shaped" between the two drain layers.

In an embodiment, a second gate structure ("band aligner structure") is positioned adjacent to a second sidewall of the second channel layer and/or a second sidewall of the drain layer. The second sidewalls of the second channel layer and the drain layer are opposite to the first sidewalls thereof.

In an embodiment, the second channel layer and the first channel layer are intrinsic or unintentionally doped, e.g., intrinsically doped. The second channel layer may include a same material as the first channel layer, but with a larger thickness. The larger thickness of the second channel layer reduces tunnel current in the OFF state and improves the turn-off characteristic of the TFET.

In another embodiment, the second channel layer includes a different semiconductor material than the first channel layers such that the second channel layer enables a smaller off-state tunnel current than the first channel layer. The second channel layer may include the same III and V elements as the first channel layer but with different element ratios.

The first gate structure is configured to apply an electrical field on the first channel layer in a vertical direction, e.g., the direction of band-to-band tunnel ("BTBT") through the first channel layer. The first gate structure is configured to apply an electric field on the second channel layer by the first sidewall of the second channel layer, e.g., orthogonal to the tunnel current, which is a weaker gate control because the direction of the electrical field intersects the direction of the charge carrier movement orthogonally.

In operation, at the ON state, the ON current flows vertically from the source layer to the first channel layer via BTBT effect and is collected by the drain layer through the second channel layer. At the ON state, the main BTBT occurs under the first gate structure, and its direction is in parallel to the gate electric field, which provides greater gate control.

At the OFF state, while the main BTBT under the first gate structure is suppressed, the source-to-drain tunnel current ("SDT") dominates since the gate control over the source to first channel junction that is not right below the first gate is weaker. However, the SDT current needs to tunnel through not only the first channel layer but also the second channel layer to be collected by the drain layer. Therefore, the SDT current (or "leakage") is suppressed by engineering or controlling the second channel layer and its tunneling barrier without affecting the ON state BTBT current that travels through the first channel layer under the first gate structure.

Therefore, a large ON state current and a small OFF state leakage current can be separately achieved owing to the effective control over different tunneling paths for the ON and the OFF state currents.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Tunneling field effect transistor ("TFET") structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the TFET structure.

The following description refers to a transistor as an example of a semiconductor structure to which the present description applies; however, the present description is not limited in applicability to transistors. For example, the following description applies to other types of semiconductor structures that are not transistors where the improved tunneling effects of the intrinsic channel region are desirable in a vertical device using GaN. Further, the disclosure also includes a vertical device using other III-V materials, which include a pyramid type upper profile, e.g., a sloped surface.

Figure 1B:
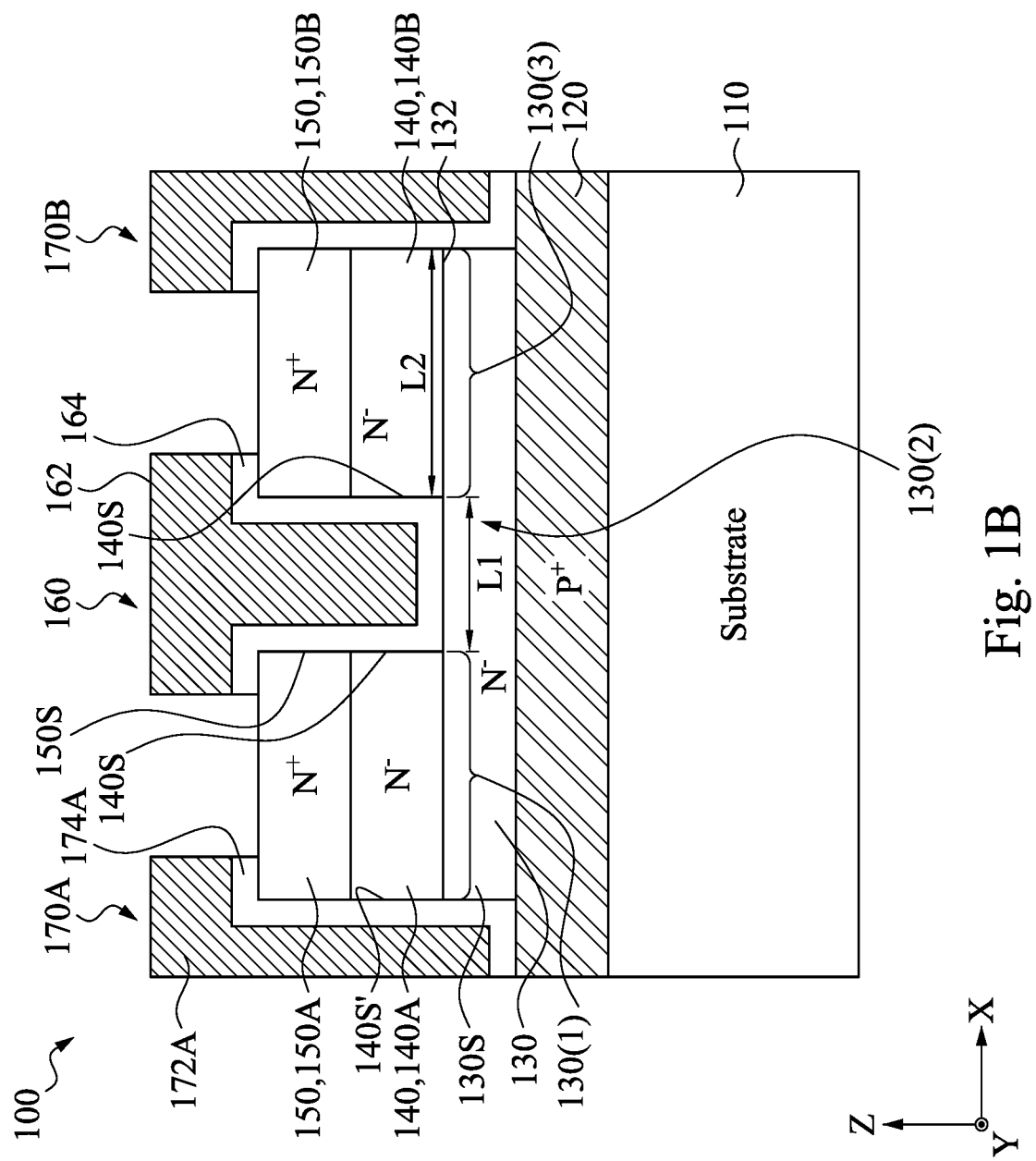

FIGS. 1A and 1B show a top view and a cross-sectional view of an example tunnel field-effect transistor ("TFET") structure 100. FIG. 1A is a top view of the structure 100 and FIG. 1B is a cross-sectional view of the structure 100 from cutting plane II-II. With reference to FIGS. 1A and 1B together, the structure 100 includes, in a vertical stack, a substrate 110, a first semiconductor layer 120, a second semiconductor layer 130, a third semiconductor layer 140, and a fourth semiconductor layer 150. The third semiconductor layer 140 and the fourth semiconductor layer 150 each include a plurality of discrete portions 140A, 140B, 150A, 150B, respectively. The discrete portions in each of the layers 140, 150 are separated from one another. For example, the portion 140A and the portion 140B of the third semiconductor layer 140 are separated from one another. Portions 140A, 150A form a vertical stack and portions 140B, 150B form a separate vertical stack. In a non-limiting embodiment, the layers 150A (or 150B) and the layer 140A (or 140B) in a vertical stack include sidewalls 150S, 140S that are plumb with one another. Each of the vertical stacks of the discrete portions 140A, 150A, 140B, 150B covers or overlaps a smaller area than the second semiconductor layer 130. Specifically, the vertical stack of 140A, 150A overlaps portion 130(1) of the second semiconductor layer 130, and the vertical stack of 140B, 150B overlaps portion 130(3) of the second semiconductor layer 130.

A gate structure 160 (first gate structure) is formed over the second semiconductor layer 130 and between the portions 140A and 140B of the third semiconductor layer 140. Specifically, the first gate structure 160 contacts portion 130(2) of the second semiconductor layer 130 and is adjacent to the sidewall 140S of each of the third semiconductor portions 140A, 140B. The portion 130(2) separates the portion 130(1) and the portion 130(3). The first gate structure 160 may also be at least partially adjacent to the portions 150A, 150B of the fourth semiconductor layer 150. The first gate structure 160 includes a gate electrode 162 and a gate dielectric 164. The gate electrode 162 is a metal material or other suitable electrically conductive material. The gate dielectric 164 is a high-K dielectric material. Because the gate dielectric 164 contacts surface 132 of the second semiconductor layer 130, specifically that of the portion 130(2), and the sidewalls 140S of the separate portions 140A, 140B of the third semiconductor layer 140, the gate dielectric 164 is essentially U-shaped, indicating a U-shaped interface between the first gate structure 160 and the portion 140A, the surface 132 and the portion 140B. The gate dielectric 164 is essentially L-shaped with respect to the surface 132 and a sidewall of one of the portions 140A, 140B.

In an embodiment, the structure 100 also includes a second gate structure 170 (shown as 170A, 170B). The second gate structure 170 contacts a sidewall 130S of the second semiconductor layer 130 and a sidewall 140S' of the portion 140A of the third semiconductor layer 140. The sidewall 140S' is a different sidewall (or a different sidewall portion) from the sidewall 140S that is adjacent to the first gate structure 160. The second gate structure 170 (170A, 170B) includes a gate electrode 172 (172A shown) and a gate dielectric 174 (174A shown), which may include the same materials as the gate electrode 162 and the gate dielectric 164 of the first gate structure 160.

FIGS. 1A and 1B show, as an embodiment, that the first gate structure 160 and the second gate structure 170 overlap surfaces of the portions 150A, 150B of the fourth semiconductor layer 150. The disclosure is not limited by this specific embodiment. For example, one or more of the first gate structure 160 or the second gate structure 170 may be substantially at a same level as the fourth semiconductor layer 150 or be lower than an upper surface of the fourth semiconductor layer 150 (150A, 150B).

In an embodiment, the structure 100 is a tunnel field-effect transistor ("TFET"). The first semiconductor layer 120 is configured as a source of the TFET. The source layer 120 is, for example, P-doped. The second semiconductor layer 130 is configured as a first channel layer. The first channel layer 130 is intrinsic or lightly N-doped ("N"). Depending on the material and the formation process, an intended intrinsic (e.g., undoped) first channel layer 130 might be unintentionally doped ("UID") (also referred to as "intrinsically doped"). The third semiconductor layer 140 (140A, 140B) is an interlayer semiconductor layer or "second channel layer." The interlayer 140 is intrinsic, unintentionally N doped or lightly N-doped.

The fourth semiconductor layer 150 (150A, 150B) is configured as a drain layer and is N-doped with a higher doping concentration than the lightly or unintentionally doped interlayer/second channel layer 140 or first channel layer 130. In an embodiment, a material of the interlayer 140 includes a higher tunneling barrier than a material of the first channel layer 130.

In an example embodiment, the substrate 110 is indium phosphide "InP", doped as P-type. The source layer 120 is gallium arsenide antimonide ("GaAsSb"). The first channel layer 130 is indium gallium arsenide ("InGaAs") and has a composition of $In_xGa_{1-x}As$. The interlayer 140 is indium gallium arsenide ("InGaAs") and has a composition of $In_yGa_{1-x}As$. In an embodiment, the interlayer 140 includes a higher ratio of Ga atoms and a lower ratio of In atoms than the channel layer, e.g., x>y. The higher ratio of Ga atoms and the lower ratio of In causes the interlayer 140 to include a higher tunneling barrier than the channel layer 130. In an example, x=0.87 and y=0.75.

The drain layer 150 includes N-doped InGaAs. The doping concentration of the drain layer 150 is much higher than the doping concentration of the lightly N-doped or unintentionally N-doped channel layer 130 and interlayer 140. In an example, the doping concentration of the drain layer 150 is more than 2 times that of the doping concentration of the lightly N-doped or unintentionally N-doped channel layer 130 and interlayer 140. In an embodiment, the doping concentration of the drain layer 150 is more than 3 times that of the doping concentration of the lightly N-doped or unintentionally N-doped channel layer 130 and interlayer 140.

Figure 1C:
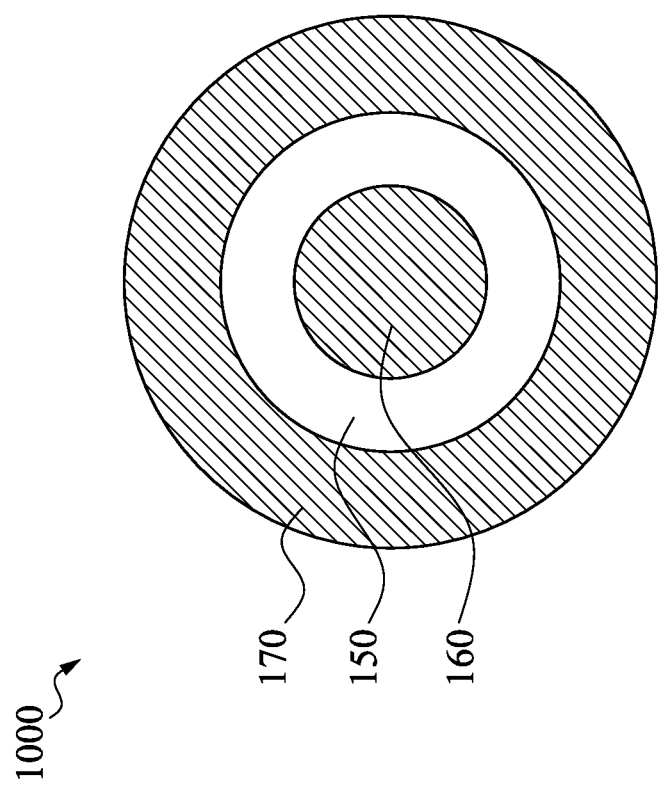
FIG. 1C illustrates a top view of an alternative embodiment of the example tunnel FET of FIG. 1B.

FIG. 1A shows, as an embodiment, that the semiconductor stack of 140A, 150A and the semiconductor stack of 140B, 150B are fin type structures separated from one another, and the second gate structures 170A, 170B are separated from one another. In another embodiment, as shown in FIG. 1C, a top view of an alternative example structure 1000, the third semiconductor layer 140 (not shown) and the fourth semiconductor layer 150 are each an integrated pattern and have a continuous shape, e.g., a ring shape. The second gate structure 170 is also an integrated pattern and has a continuous shape. The description of FIG. 1B also applies to the example structure 1000 of FIG. 1C.

Figure 2A:
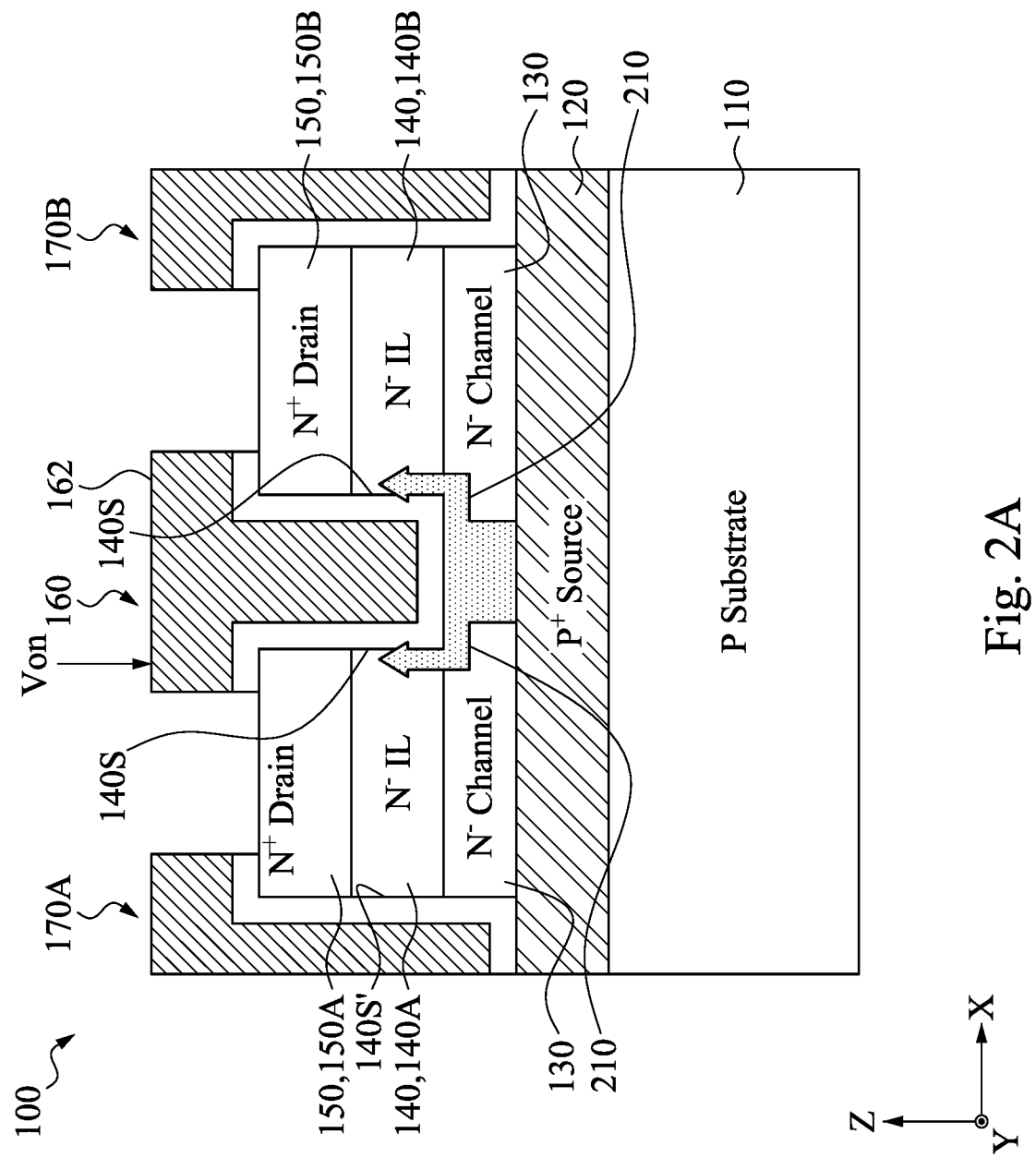
FIGS. 2A and 2B illustrate ON state and OFF state tunneling effects of the example tunnel FET of FIG. 1B, respectively.
Figure 2B:
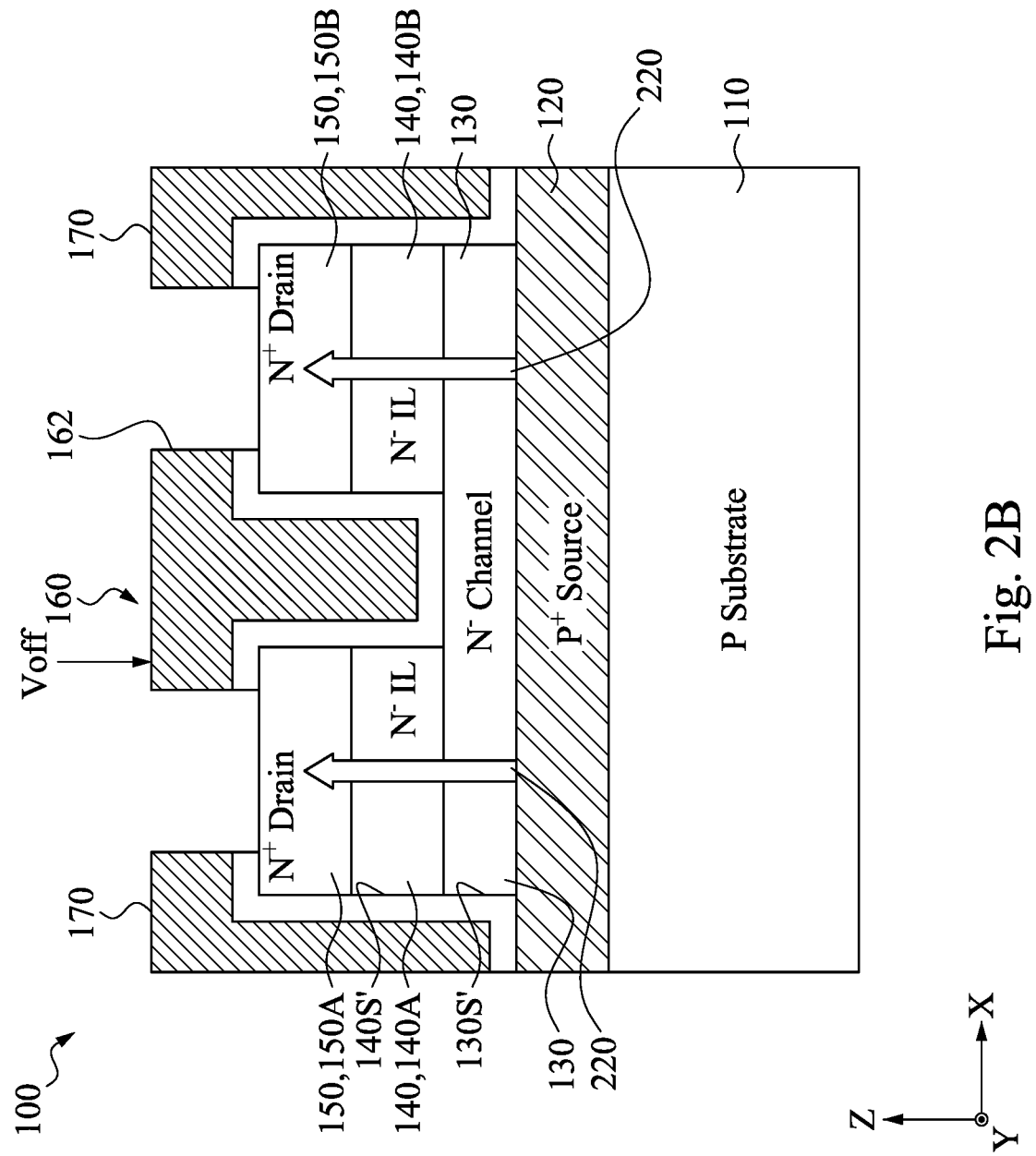

FIGS. 2A and 2B schematically show the operation of the TFET 100 of FIG. 1. FIG. 2A show an ON state of the TFET 100. An ON voltage $V_{On}$ is applied on the gate electrode 162 of the first gate structure 160. Through the tunneling effect, the ON state current flows vertically from the source layer 120 to the first channel layer 130 via a band-to-band tunneling ("BTBT") effect and is collected by the drain layer 150 through the second channel layer 140. An arrow 210 illustrates the charge carrier movement direction. As shown by the arrow 210, at the ON state, the main BTBT occurs under the first gate structure 160. For this main BTBT, the ON voltage $V_{On}$ creates an electrical field in a direction that is in parallel with the charge carrier movement 210, which provides greater gate control. After the main BTBT, the tunnel current moves through the second channel layer 140 (140A, 140B) through the sidewall 140S area that is controlled by the ON voltage $V_{On}$ in an orthogonal intersect direction. Because the main BTBT has already passed through the greater gate control on the first channel layer 130, the second channel layer 140 (140A, 140B) does not substantially affect the ON state current.

At the OFF state, as shown in FIG. 2B, an OFF voltage Voff is applied on the gate electrode 162 of the first gate structure 160. While the main BTBT under the first gate 160 is much suppressed by the Voff, the source-drain tunnel ("SDT") current, shown as arrow 220, dominates due to the weaker gate control over the source/channel junction that is not right below the first gate structure 160. The SDT current needs to tunnel through not only the first channel layer 130, but also the second channel layer 140. Therefore, the existence of the second channel layer/interlayer 140 substantially lowers the SDT current, e.g., the leakage current, at the OFF state. The SDT leakage is suppressed by engineering or controlling the thickness of the interlayer 140 and its tunneling barrier. As described herein, the thickness and the tunneling barrier of the second layer 140 do not affect the ON state of the BTBT current that is mainly controlled by a parallel gate electrical field under the first gate structure 160, as shown in FIG. 2A.

Therefore, both a large ON current and a low OFF leakage can be achieved owing to the effective control over different tunneling paths separately for the ON and OFF state currents.

The second gate structure 170 functions to further suppress the BTBT current through the interface region adjacent to the sidewall 130S of the first channel layer 130 and the sidewall 140S' of the interlayer 140. Specifically, the second gate structure 170 functions to provide extra control over the SDT channel, e.g., the first channel layer 130 plus the second channel layer 140, to misalign the bands for the SDT leakage. As such, the second gate structure 170 may also be referred to as a "band aligner." The voltage applied onto the second gate structure 170 can be the same as or different from the voltage applied onto the first gate structure 160, depending on the operational requirements. In an embodiment, to maximize the band aligning function, the second gate structure 170 is controlled by a separate control voltage signal from that of the first gate 160. The second gate structure 170 has a less significant effect on the ON state BTBT current because its gate electric field is orthogonal to the main BTBT current from the source 120 through the first channel layer 130, as shown in FIG. 2A.

Figure 3:
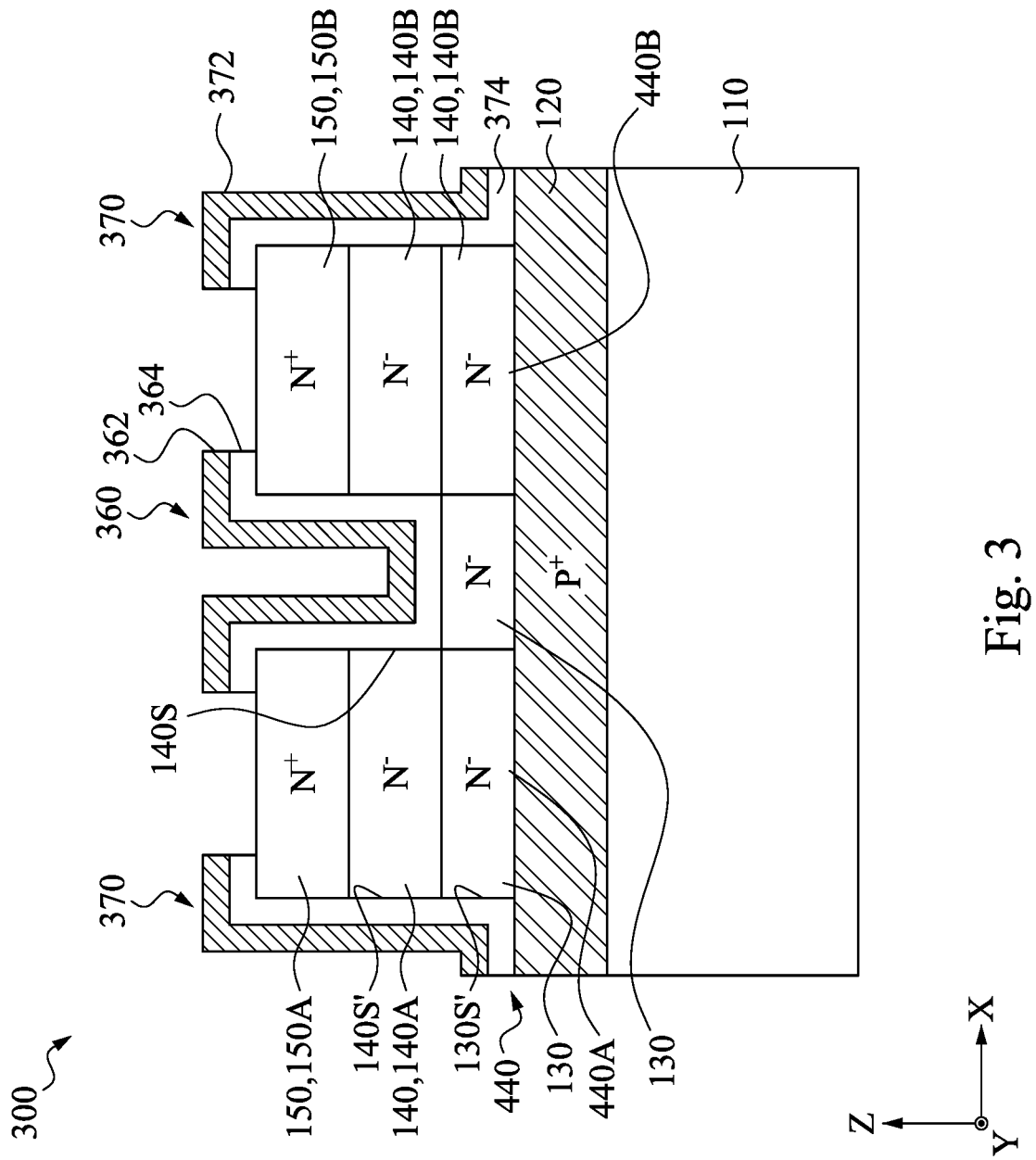
FIGS. 3-6 illustrate four alternative embodiments of example tunnel FET structures according to embodiments of the disclosure.

FIGS. 3-6 show alternative and/or additional embodiments with respect to the TFET 100 of FIG. 1A-1C. Referring to FIG. 3, in example TFET structure 300, a first gate structure 360 and a second gate structure 370 each include a gate electrode 362, 372 over a respective gate dielectric 364, 374 and follow the profile of the gate dielectric 364, 374. That is, the gate electrode 362 also includes a U-shaped profile.

Further, the TFET 300 also includes an additional interlayer semiconductor layer 440 (440A, 440B) stacked under the drain 150 and the interlayer 140 and adjacent to the first channel layer 130. In an embodiment, the additional interlayer 440 (second interlayer) includes a semiconductor material having a tunneling barrier higher than that of the first channel layer 130 and lower than that of the interlayer 140 (first interlayer or second channel layer). In an example, the first channel layer 130 is $In_xGa_{1-x}As$, the first interlayer 140 is $In_yGa_{1-y}As$, and the second interlayer 440 is $In_zGa_{1-z}As$ and $x>z>y$. In an example, $x=0.87$, $z=0.80$ and $y=0.75$. The second interlayer 440 is also referred to as a "third channel layer." The third channel layer 440 is laterally adjacent to the first channel layer 130 and substantially at a same level as the first channel layer 130. The third channel layer 440 is below the second channel layer 140.

Because the ON state BTBT current travels through the first channel layer 130 below the first gate 360 and through the interface region adjacent to the sidewall 140S of the first interlayer/second channel layer 140, the second interlayer/third channel layer 440 (440A, 440B) does not substantially affect the ON state BTBT current. At the OFF state, as the tunneling barrier of the second interlayer (or third channel layer) 440 is higher than that of the first channel layer 130, the leakage current is further reduced as compared to the TFET 100 of FIG. 1.

Figure 4:
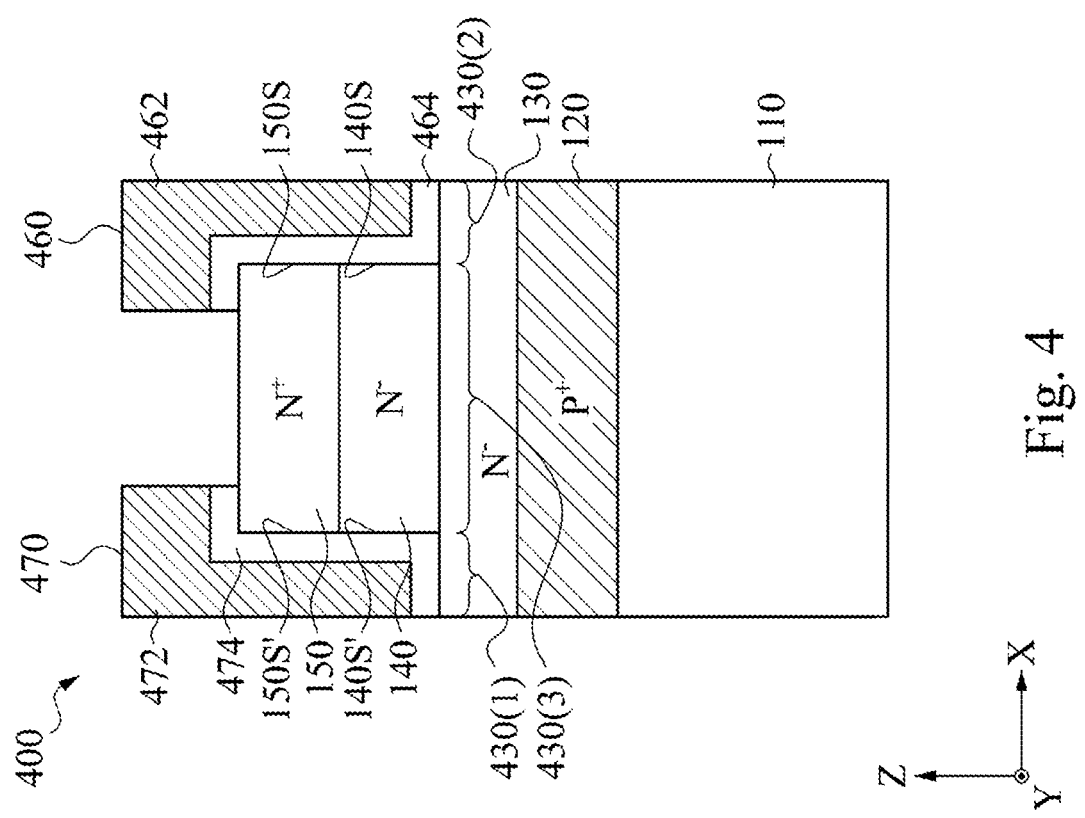

FIG. 4 shows another example TFET 400. The TFET 400 includes a first gate structure 460 and a second gate structure 470. Each of the gate structures 460, 470 contact a surface portion 430(1), 430(2) of the first channel layer 130 and contact a sidewall 140S, 140S' of the interlayer 140. The gate structures 460, 470 may also contact a sidewall 150S, 150S' of the drain layer 150. The sidewalls 140S, 150S are opposite to the respective sidewalls 140S', 150S'. The drain layer 150 and the interlayer 140 overlap a portion 430(3) of the first channel layer 130. The portion 430(3) is positioned between the portions 430(1) and 430(2).

In an embodiment, the gate structures 460, 470 are portions of a single gate structure that wraps around the interlayer 140 and wraps at least partially around the drain layer 150.

In an embodiment, the TFET 300 includes only one stack of the drain layer 150 and the interlayer 140 over the channel layer 130.

Figure 5:
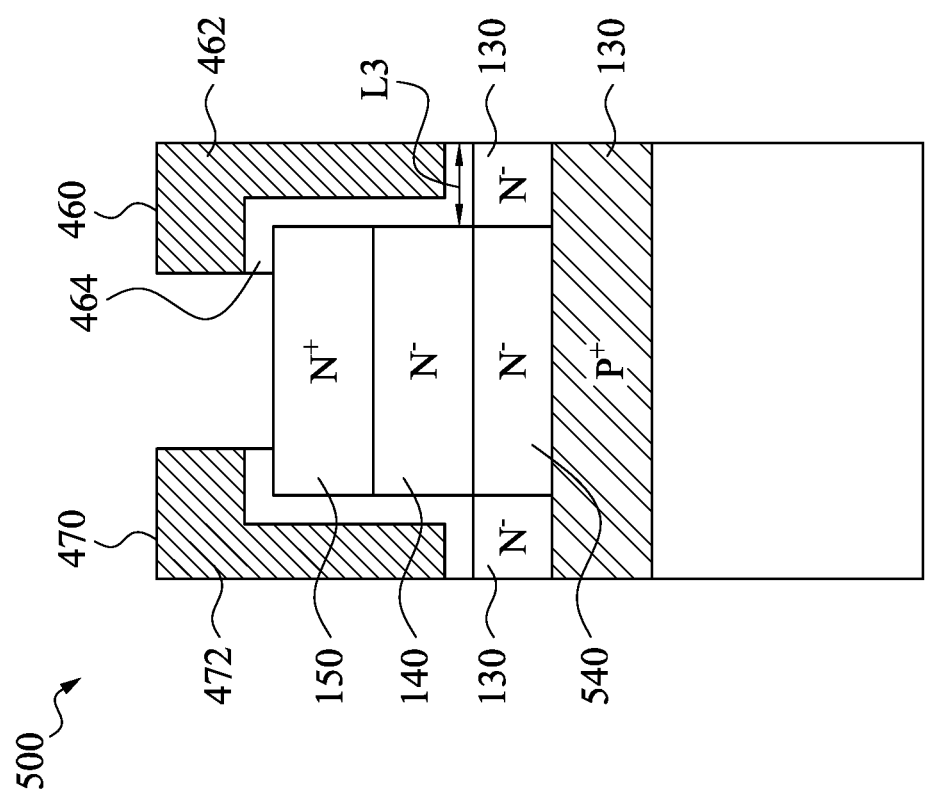

FIG. 5 shows another example TFET 500. The TFET 500 is similar to the TFET 400 of FIG. 4, except that the TFET 500 includes a second interlayer/third channel layer 540 vertically below the interlayer 140 (first interlayer) and laterally between or within the first channel layer 130. The second interlayer/third channel layer 540 includes a semiconductor material that has a higher tunneling barrier than the first channel layer 130. In an example, the first channel layer 130 is $In_xGa_{1-x}As$, the first interlayer 140 is $In_yGa_{1-y}As$, and the second interlayer 540 is $In_zGa_{1-z}As$ and $x>z>y$. In an example, $x=0.87$, $z=0.80$ and $y=0.75$.

Figure 6:
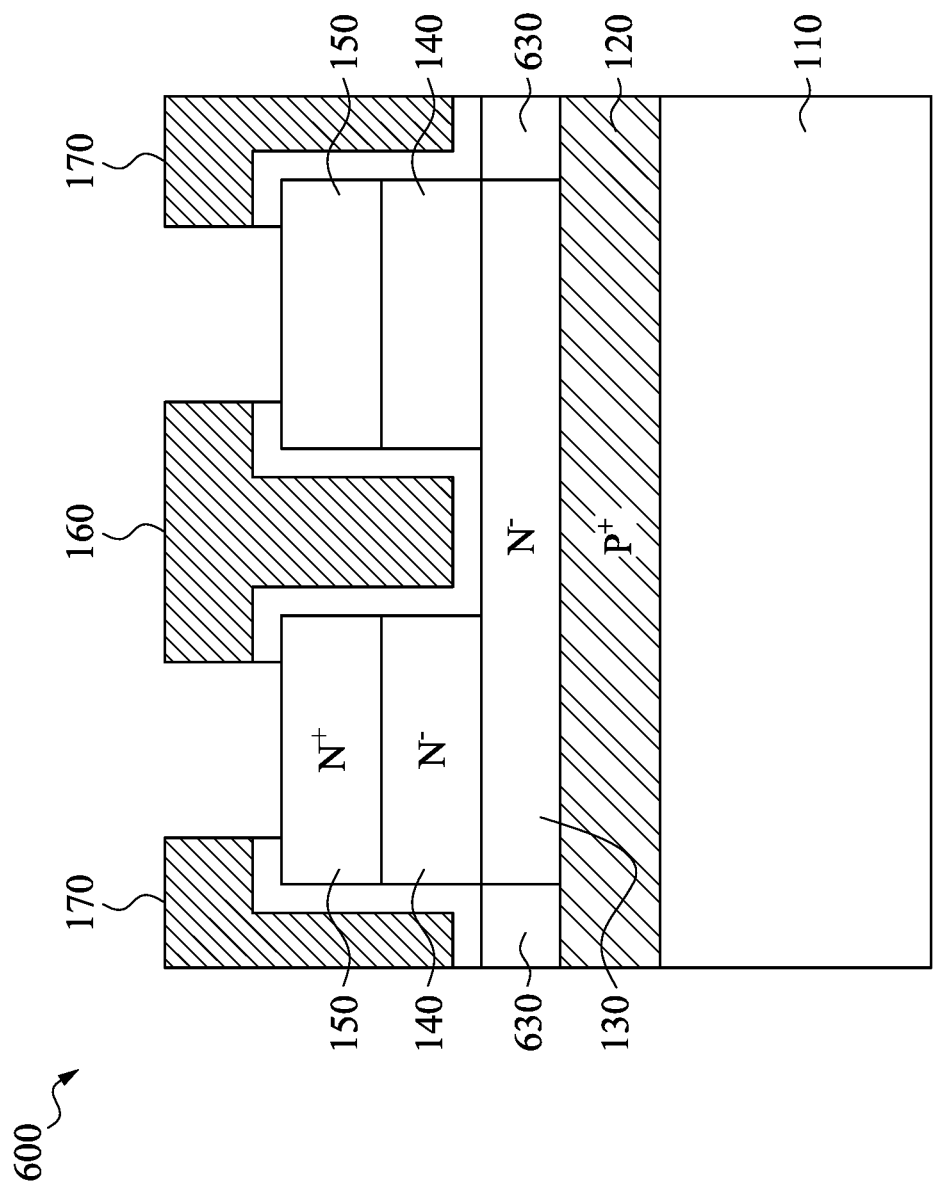

FIG. 6 shows another example TFET 600. The TFET 600 is similar to the TFET 100 of FIG. 1, except that the second gate structure 170 does not contact the first channel layer 130. An insulation layer 630, e.g., of dielectric, is positioned laterally adjacent to the first channel layer 130 and vertically between the second gate structure 170 and the source layer 120.

The example TFETS 100, 1000, 300, 400, 500, 600 and the portions thereof may be combined and/or replaced among one another in various ways, which are all included in the disclosure.

In all the embodiment TFETS 100, 1000, 300, 400, 500, 600, the thickness of the first channel layer 130 is controlled to be relatively thin to achieve a high ON state current. In an embodiment, the first channel layer 130 is thinner than 10 nm. In an embodiment, the first channel layer 130 has a thickness ranging from 4 nm to about 10 nm.

A thickness of the first interlayer (or second channel layer) 140 is relatively thick, as compared to the first channel layer 130, to increase the tunneling barrier so that the OFF leakage current is low. In an embodiment, the first interlayer 140 has a thickness ranging between 20 to 50 nm.

The second interlayer (or third channel layer) 440, 540 is substantially coplanar with the respective channel layer 130 and has a similar thickness as the respective channel layer 130.

The first gate structure 160, 360 include a length (L1 in FIG. 1B) larger than about 5 nm to ensure sufficient BTBT tunneling for the ON current. In an embodiment, the first gate structure 160, 360 includes a gate length ranging from about 6 nm to about 15 nm. The first gate structure 460 and the second gate structure 470 include a length (L3 in FIG. 5) larger than 3 nm. In an embodiment, the gate length L3 ranges from about 3 nm to about 10 nm.

The interlayer 140 and the drain layer 150 each include a length (L2 in FIG. 1B) larger than about 10 nm.

The gate structures 160, 170, 460, 470 are metal gates. The following description lists examples of materials for the gate structure 160, 170, 460, 470. The gate electrode 162, 172, 462, 472 of the gate structure 160, 170, 460, 470 includes a conductive material, e.g., a metal or a metal compound. Suitable metal materials for the gate electrode 162, 462 of the gate structure 160, 170, 460, 470 include ruthenium, palladium, platinum, tungsten, cobalt, nickel, and/or conductive metal oxides and other suitable P-type metal materials and include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, the gate electrode 162, 172, 462, 472 of the gate structures 160, 170, 460, 470 includes a work function layer tuned to have a proper work function for enhanced performance of the field effect transistor devices. For example, suitable N-type work function metals include Ta, TiAl, TiAlN, TaCN, other N-type work function metals, or a combination thereof; and suitable P-type work function metal materials include TiN, TaN, other P-type work function metals, or combination thereof. In some examples, a conductive layer, such as an aluminum layer, a copper layer, a cobalt layer or a tungsten layer is formed over the work function layer such that the gate electrode 162, 172, 462, 472 of gate structure 160, 170, 460, 470 includes a work function layer disposed over the dielectric layer 164, 174, 464, 474 and a conductive layer disposed over the work function layer and below a gate cap (not shown for simplicity). In an example, the gate electrode 162, 172, 462, 472 of the gate structure 160, 170, 460, 470 has a thickness ranging from about 5 nm to about 40 nm depending on design requirements.

In example embodiments, the dielectric layer 164, 174, 464, 474 includes an interfacial silicon oxide layer (not separately shown for simplicity), e.g., a thermal or chemical oxide having a thickness ranging from about 5 to about 10 angstrom (A). In example embodiments, the dielectric layer 144 further includes a high dielectric constant (high-K) dielectric material selected from one or more of hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfArO), combinations thereof, and/or other suitable materials. A high K dielectric material, in some applications, includes a dielectric constant (K) value larger than 6. Depending on design requirements, a dielectric material of a dielectric contact (K) value of 7 or higher is used. The high-K dielectric layer may be formed by atomic layer deposition (ALD) or other suitable technique. In accordance with embodiments described herein, the high-K dielectric layer of the gate dielectric layer includes a thickness ranging from about 10 to about 30 angstrom (A) or other suitable thickness. Other dielectric materials can also be used for the dielectric layer 164, 174, 464, 474, e.g., MgCaO or $Al_2O_3$.

In example embodiments, the insulation layer 630 (FIG. 6) is silicon oxide or a low-K dielectric material. A low-K dielectric material includes as silicon oxynitride, silicon nitride (Si3N4), silicon monoxide (SiO), silicon oxycarbide (SiOC), vacuum, and other dielectrics or other suitable materials.

Figure 7:
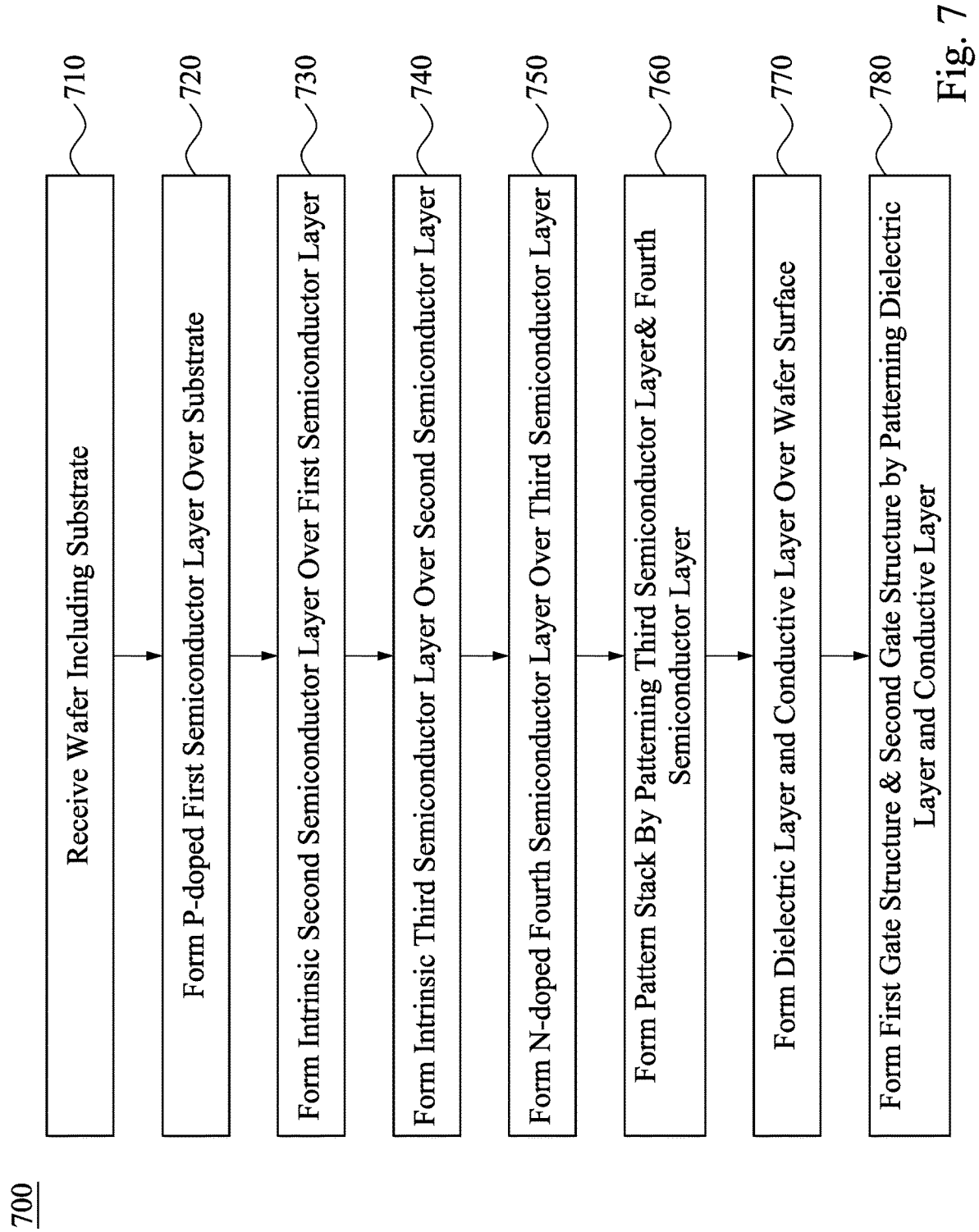
FIG. 7 is a flow diagram of an example fabrication process according to embodiments of the disclosure.

FIG. 7 shows an example fabrication process 700. FIGS. 8A to 8H show a wafer 800 in various stages of the fabrication process 700 in making a transistor device, e.g., TFET devices 100, 300, 400, 500, 600 of the disclosure. The example TFET 100 of FIG. 1 is used as an example to illustrate the example fabrication process 700.

Referring to FIG. 7, with reference also to FIG. 8A, in example operation 710, a wafer 800 is received. The wafer 800 includes a substrate 810. The substrate 810 is an indium phosphide ("InP") substrate or a silicon substrate having an InP layer thereover. The substrate 810 may also include other element semiconductors, such as germanium, or other compound semiconductors, such as silicon carbide, gallium arsenide, indium arsenide, and/or sapphire. Further, the substrate 810 may also include a silicon-on-insulator (SOI) structure. The substrate 810 may include an epitaxial layer and/or may be strained for performance enhancement. The substrate 810 may also include various doping configurations depending on design requirements as is known in the art, such as P-type substrate and/or N-type substrate and various doped regions such as P-wells and/or N-wells. As an illustrative example, the substrate 810 is a P-doped InP substrate.

In example operation 720, with reference also to FIG. 8B, a first semiconductor layer 820 of a P-doped III-V compound semiconductor material, e.g., GaAsSb, is formed over the InP substrate 810. The GaAsSB layer 820 is formed using an epitaxy process, e.g., metalorganic chemical vapor deposition ("MOCVD") or molecular beam epitaxy ("MBE"). For example, the MOCVD process uses one or more of TMGa, TEGa or TTBGa as the Ga source precursor, one or more of TBAs, TMAs, DETBAs as the As source precursor and one or more of TMSb or TESb as the Sb source precursor. In an embodiment, the GaAsSb layer 820 is doped as P-type by the supply of additional Si, Mg, C or Zn containing precursors, e.g., $CBr_4$ for C source, $Si_2H_6$ for Si source or DEZn for Zn source. Other suitable doping procedures, e.g., ion implantation of Si, Mg, C or Zn impurities for P-type doping, are also possible and included in the disclosure. The MOCVD growth temperature for the GaASSb layer 820 ranges between about 500° C. and about 600° C.

Figure 8C:
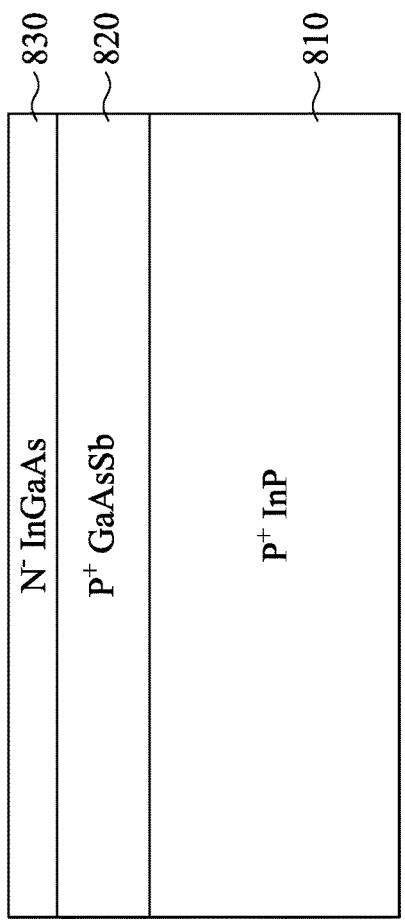

In example operation 730, with reference also to FIG. 8C, a second semiconductor layer 830 of a second compound semiconductor material, e.g., InGaAs, is formed over the GaAsSb layer 820. The InGaAs layer 830 is formed using an epitaxy process, e.g., metalorganic chemical vapor deposition ("MOCVD") or molecular beam epitaxy ("MBE"). For example, the MOCVD process uses one or more of TMIn or DADI as the In source precursor, one or more of TMGa, TEGa or TTBGa as the Ga source precursor, one or more of TBAs, TMAs, DETBAs as the As source precursor. In an embodiment, the InGaAs layer 830 is intrinsic or unintentionally lightly doped as N-type. In other embodiments, the InGaAs layer 830 is intentionally doped lightly as N-type ("N") using an impurity gas of dopant precursors of DETe as the Te source or $Si_2H_6$ as the Si source. The MOCVD growth temperature for the InGaAs layer 830 ranges between about 500° C. and about 700° C. In an embodiment, the InGaAs alloy has a composition of $In_xGa_{1-x}As$, with 0<x<1, where x indicates the atom ratio of In as compared to the atom ratio of Ga in the alloy. Note that the InGaAs alloy includes InAs and GaAs. If x=0.3, it means that 30 percent of the alloy composition is InAs and 70% of the alloy composition is GaAs. In some embodiment, $0.2 \leq x \leq 0.9$.

In an embodiment, the thickness of the InGaAS layer 830 is controlled to be less than 10 nm.

Figure 8D:
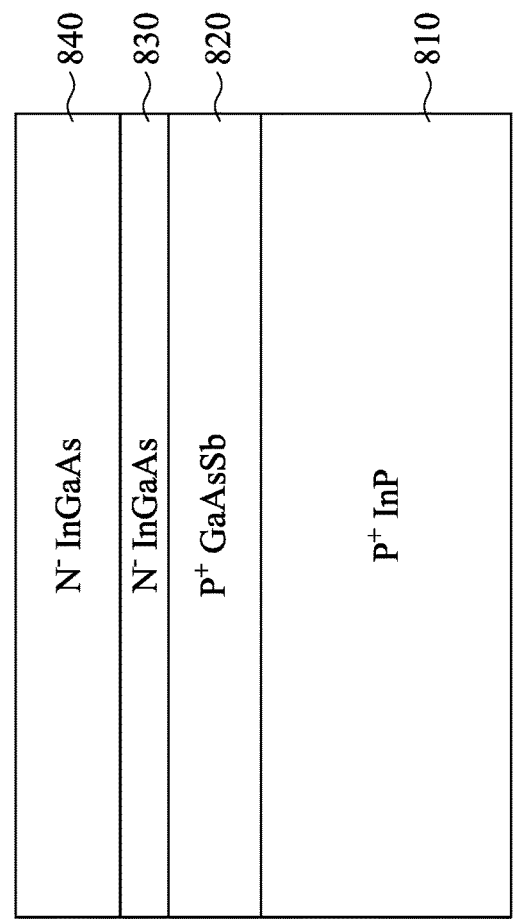

In example operation 740, with reference also to FIG. 8D, a third semiconductor layer 840 of III-V compound semiconductor material is formed over the second semiconductor layer 830. The third semiconductor layer 840 may include an InGaAs alloy having composition of $In_yGa_{1-y}As$, where y indicate the atom ratio of In as compared to the atom ratio of Ga in the alloy and where y≤x. In some embodiment, y<x. That is, the InGaAs alloy in the third semiconductor layer 840 includes a higher ratio of Ga with respect to In as compared to the second semiconductor layer 830. As such, the $In_yGa_{1-y}As$ layer 840 includes a higher tunneling barrier than the $In_xGa_{1-x}As$ layer 830. In an embodiment, the InGaAS layer 840 is intrinsic or unintentionally lightly doped as N-type. In other embodiments, the InGaAs layer 830 is intentionally doped lightly as N-type ("N") using an impurity gas of dopant precursors of DETe as the Te source or $Si_2H_6$ as the Si source.

Figure 8E:
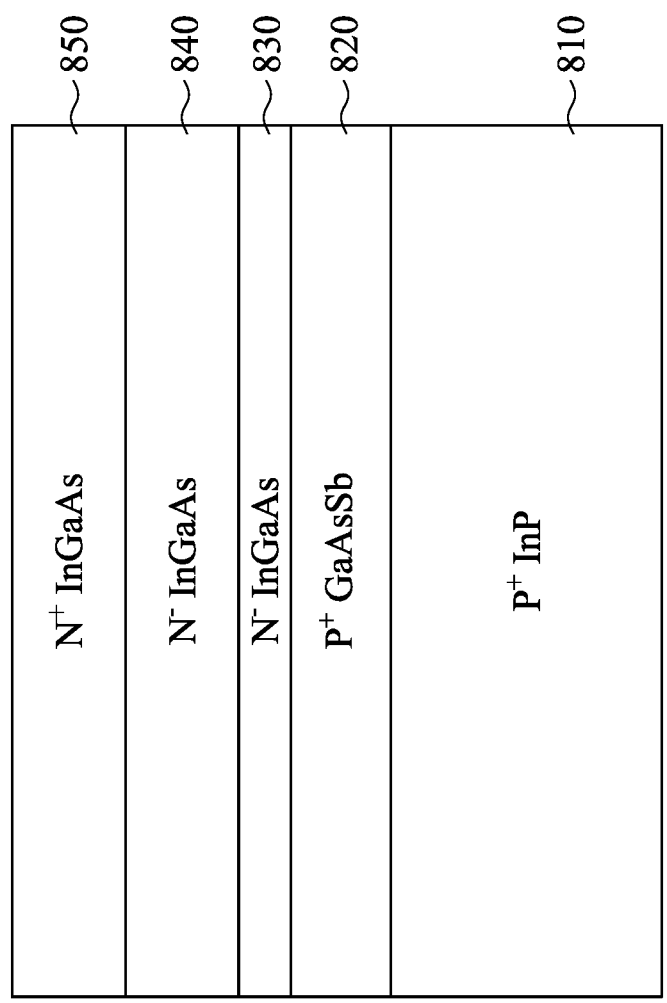

In example operation 750, with reference also to FIG. 8E, a fourth semiconductor layer 850 of III-V compound semiconductor material is formed over the third semiconductor layer 840. The fourth semiconductor layer 850 may include an InGaAs alloy doped as N-type. For example, the InGaAs layer 850 is formed with an additional impurity gas supply of dopant precursors of DETe as the Te source or $Si_2H_6$ as the Si source. The doping concentration of the InGaAs layer 850 ($N^+$) is higher than that of the unintentionally doped or lightly doped InGaAs layers 830, 840. The unintentionally doped InGaAs layers 830, 840 may include an average impurity/carrier concentration of about $(5\pm1.3)*10^{11}$ $cm^{-3}$. In an embodiment, the doping concentration of the InGaAs layer 850 is more than 2 times higher than that of the unintentionally doped or lightly doped InGaAs layers 830, 840. In another embodiment, the doping concentration of the InGaAs layer 850 is more than 3 times higher than that of the unintentionally doped or lightly doped InGaAs layers 830, 840.

Figure 8F:
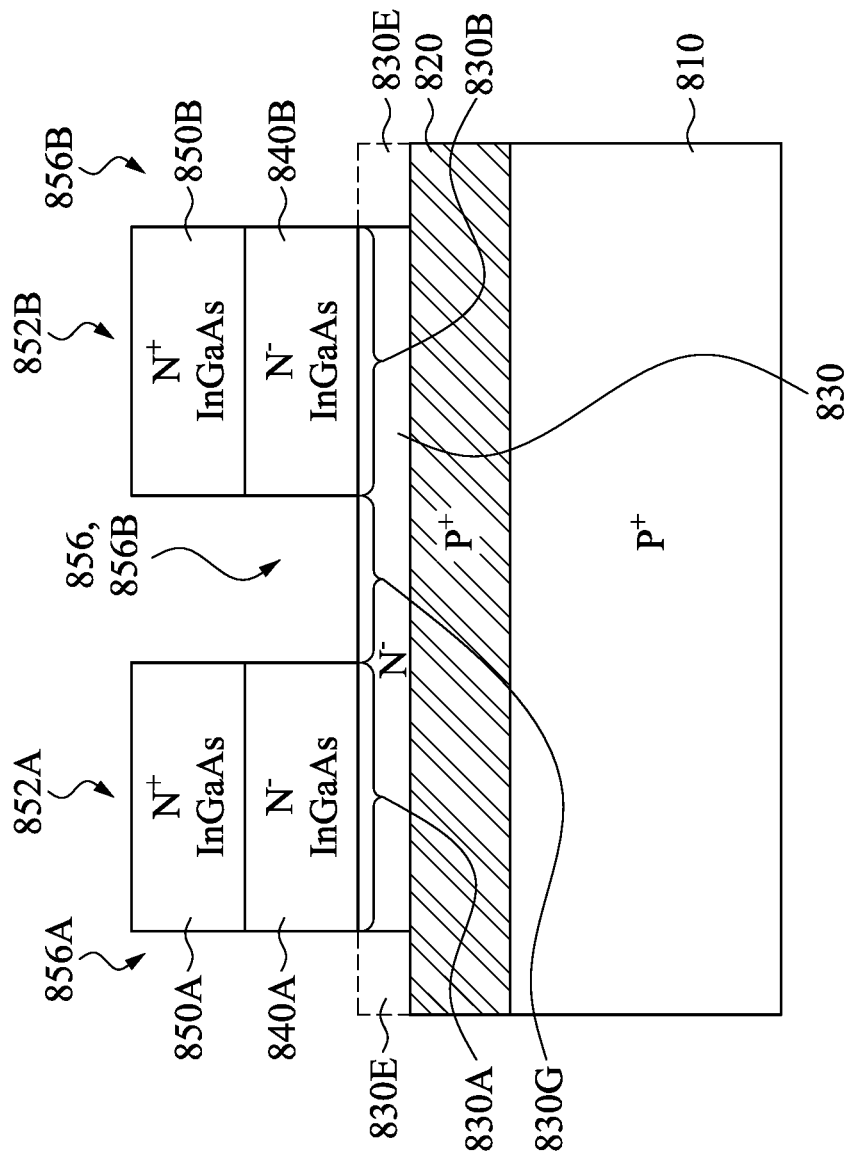

In example operation 760, with reference also to FIG. 8F, the InGaAs layers 840, 850 are patterned to form pattern stacks 852A, 852B. The pattern stack 852A includes a first pattern portion 850A of the InGaAs layer 850 over a first pattern portion 840A of the InGaAs layer 840. The pattern stack 852B includes a second pattern portion 850B of the InGaAs layer 850 over a second pattern portion 840B of the InGaAs layer 840. The pattern stacks 852A, 852B overlap or cover a surface portion 830A, 830B of the InGaAs layer 830, respectively, and are spaced apart from one another. A surface portion 830G of the InGaAS layer 830 is positioned between the surface portions 830A and 830B.

In an embodiment, the InGaAs layer 830 is also patterned to remove edge portions 830E (shown in dotted lines) that laterally extend outward beyond the surface portions 830A, 830B.

The processes 740-760 show a top-down approach of forming the pattern stacks 852A, 852B. In another embodiment, the pattern stacks 852A, 852B may also be formed using a bottom-up approach. For example, as shown in FIG. 8F(1), a mask layer 854 is formed and patterned over the InGaAs layer 830 to have apertures 856A, 856B exposing the surface portions 830A, 830B. The pattern stacks 852A, 852B are formed within the apertures 856A, 856B using selective area growth ("SAG") approaches using MOCVD, vapor-phase epitaxy and/or crystal facet-controlled epitaxial lateral overgrowth ("FACELO") techniques or other suitable growth mechanisms.

Within each of the pattern stack 852A, 852B, the layers 840A, 850A, 840B, 850B may be formed through controlling the precursor components and ratios and other growth conditions, or other suitable approaches, which are all included in the disclosure. Subsequently, the remaining mask layer 854 may be removed using selective etching and the InGaAS layer 830 may be patterned to obtain the wafer 800 stage as shown in FIG. 8F.

Figure 8G:
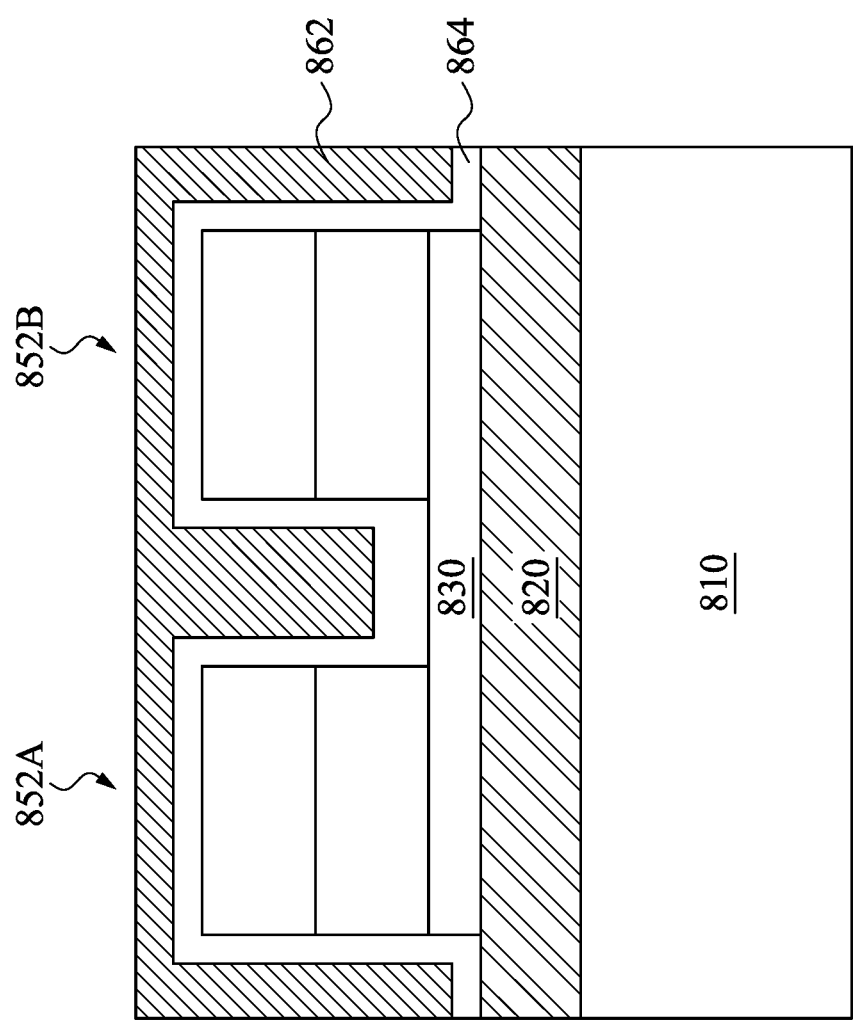

In example operation 770, with reference also to FIG. 8G, a high-K gate dielectric layer 864, e.g., $HfO_2$, and a conductive layer 862 are formed over the surface of the wafer 800. The high-K dielectric material may be selected from one or more of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfArO), combinations thereof, and/or other suitable materials $ZrO_2$, $Al_2O_3$, LaO, TiO, $Ta_2O_5$, $Y_2O_3$, STO, BTO, BaZrO, HfZrO, HfLaO. The high-K dielectric layer 864 may be formed by atomic layer deposition ("ALD") or other suitable technique. In accordance with embodiments described herein, high-K dielectric layer 864 includes a thickness ranging from about 5 to about 20 angstrom (A) or other suitable thickness.

The conductive layer 862 is tungsten (W) or titanium nitride (TiN). Other suitable materials for conductive layer 862 may include ruthenium, palladium, platinum, tungsten, cobalt, nickel, and/or conductive metal oxides, hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable conductive materials.

The conductive layer 862 may be formed through sputtering or atomic layer deposition ("ALD").

Figure 8H:
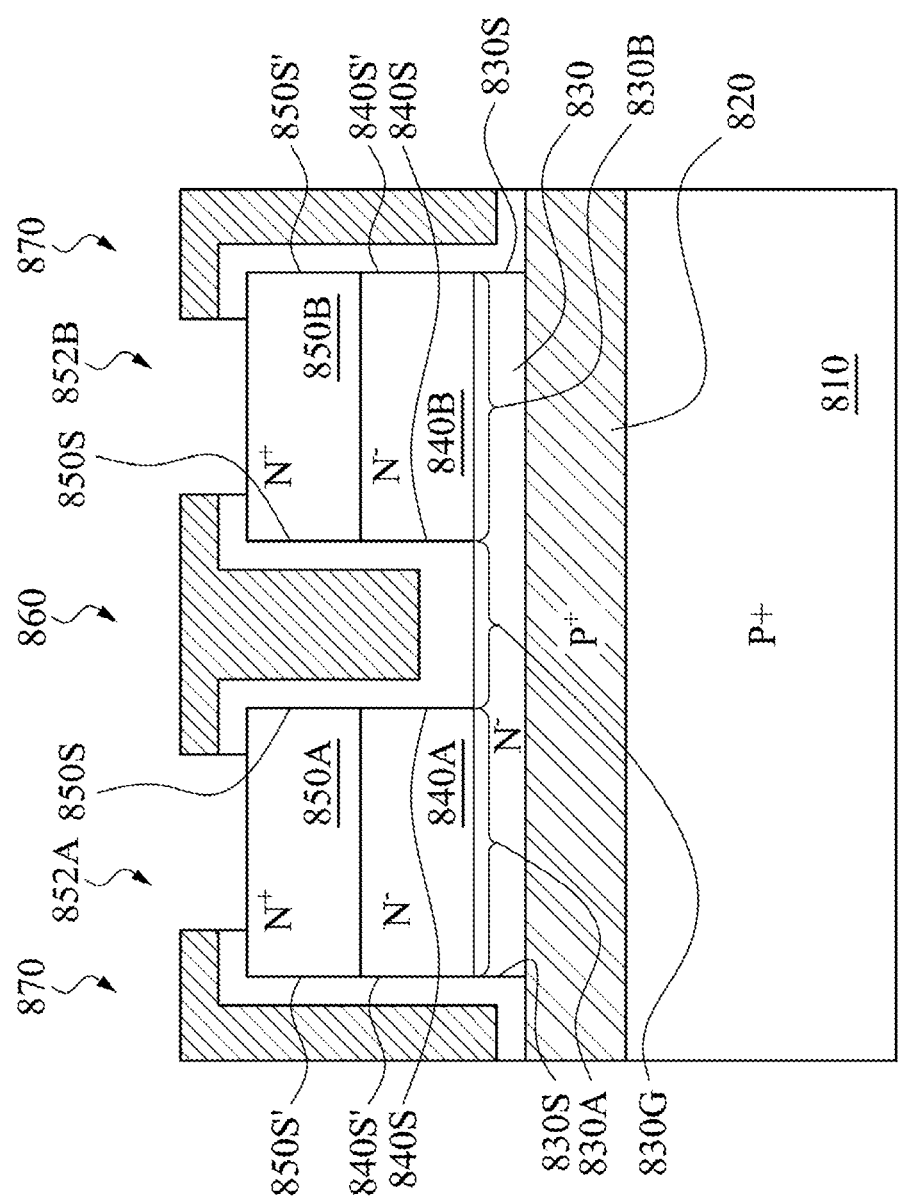

In example operation 780, with reference also to FIG. 8H, the conductive layer 862 and the dielectric layer 864 are patterned to form first gate structure 860 and second gate structures 870. The first gate structure 860 and the second gate structures 870 are separated from one another. The first gate structure 860 is positioned between the pattern stacks 852A, 852B and is adjacent to the sidewalls 850S, 840S of the layers 850 (850A, 850B), 840 (840A, 840B). The first gate 860 is also adjacent to the surface portion 830G of the second semiconductor layer 830.

The second gate structures 870 are each adjacent to the sidewalls 850S', 840S' of the layers 850 (850A, 850B), 840 (840A, 840B). The sidewalls 850S', 840S' are different from, e.g., opposite to, the sidewalls 840S, 850S. The second gate structures 870 are also adjacent to sidewalls 830S of the second semiconductor layer 830 and are adjacent to the first semiconductor layer 820.

In an embodiment, the first semiconductor layer 820 ($P^+$ type) is configured as a source of a N-type TFET, the second semiconductor layer 830 ($N^-$ type or intrinsic) is configured as a first channel layer, the third semiconductor layer 840 (($N^-$ type or intrinsic 840A, 840B) is configured as a second channel layer (or an interlayer), and the fourth semiconductor layer 850 ($P^+$ type 850A, 850B) is configured as a drain layer. The two pattern stacks 852A, 852B each covers or overlaps a surface portion 830A, 830B, respectively, of the channel layer 830. The surface portions 830A, 830B are separated by the surface portion 830G that is in contact with the first gate structure 860.

Although illustrated with the example TFET 100, the example process 700 may be used, with slight modifications/variations, to make other TFET structures or other transistor structures. FIG. 9 shows three example TFET structures 900A, 900B and 900C, which can be made by the example process 700 and are included in the structure embodiments of the disclosure. The three examples 900A, 900B and 900C are not shown to include a second gate structure for simplicity purposes. A second gate structure may be added to one or more of the structures 900A, 900B or 900C. The three examples 900A, 900B and 900C show that different materials may be used for the source, first channel, interlayer (second channel) and/or drain layers of a TFET of the disclosure. The process and structures are also applicable to a P-type TFET with a P-doped drain layer.

The second channel layer vertically stacked between the first channel and the drain improves the OFF state characteristic of the disclosed TFETs because the source to drain leakage tunneling is substantially blocked by the second channel. The U-shaped or L-shaped first gate applies a gate electrical field in parallel to the main BTBT current moving from the source to the first channel, which ensures a high ON state BTBT current. The second gate structure further enhances the OFF state characteristic by adding additional gate control of the first channel and second channel to misalign the conductivity bands.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments:

In a tunnel field-effect transistor embodiment, a tunnel field-effect transistor includes a substrate, a source layer over the substrate, a first channel layer over the source layer, the first channel layer including a first portion and a second portion, a second channel layer over the first portion of the first channel layer, a first drain layer over the second channel layer, and a first gate structure over the second portion of the first channel layer and adjacent to a first sidewall of the second channel layer.

In another semiconductor structure embodiment, a structure includes: a substrate, a first semiconductor layer of a first III-V compound semiconductor material and doped as a first conductivity type over the substrate, a second semiconductor layer of a second III-V compound semiconductor material over the first semiconductor layer, a gate structure positioned over and contacting a first upper surface portion of the second semiconductor layer, and two vertical semiconductor stacks adjacent to the gate structure from two opposite sides of the gate structure. Each of the two vertical semiconductor stacks includes a third semiconductor layer and a fourth semiconductor layer. The third semiconductor layer has a same second III-V compound semiconductor material as the second semiconductor layer but with a different material composition. The fourth semiconductor layer is doped as a second conductivity type different from the first conductivity type.

A method embodiment forms a first semiconductor layer of a first III-V compound semiconductor material and a first conductivity type over a substrate. A second semiconductor layer is formed over the first semiconductor layer. The second semiconductor layer has a first portion and a second portion adjacent to the first surface portion. The second portion has a second III-V compound semiconductor material. A vertical stack of semiconductor layers are formed over the first portion of the second semiconductor layer. The vertical stack includes a third semiconductor layer and a fourth semiconductor layer stacked over the third semiconductor layer. The third semiconductor layer has a same second III-V compound semiconductor material as the second portion of the second semiconductor layer but with a different material composition. The fourth semiconductor layer has a second conductivity type. A gate structure is formed over the second portion of the second semiconductor layer. The gate structure contacts a sidewall of the third semiconductor layer.

The invention claimed is:

1. A tunnel field-effect transistor, comprising:
a substrate;
a source layer over the substrate;
a first channel layer over the source layer, the first channel layer including a first portion and a second portion arranged laterally with respect to the first portion;
a second channel layer over the first portion of the first channel layer, the second channel layer including a same conductivity type as the first channel layer;
a first drain layer over the second channel layer; and
a first gate structure over the second portion of the first channel layer, adjacent to the first channel layer only from a vertical direction and adjacent to a first sidewall of the second channel layer from a lateral direction that is traverse to the vertical direction;
wherein each of the first channel layer and the second channel layer includes a different doping type from that of the source layer.

2. The tunnel field-effect transistor of claim 1, wherein the first gate structure is adjacent to a first sidewall of the first drain layer.

3. The tunnel field-effect transistor of claim 1, wherein the first gate structure includes a gate dielectric, the gate dielectric being L-shaped with respect to the first sidewall of the second channel layer and the second portion of the first channel layer.

4. The tunnel field-effect transistor of claim 1, wherein a material of the second channel layer has a higher tunneling barrier than a material of the first channel layer.

5. The tunnel field-effect transistor of claim 1, wherein the second channel layer includes a larger thickness than the first channel layer.

6. The tunnel field-effect transistor of claim 1, wherein the first portion of the first channel layer includes a material composition that is different from a material composition of the second portion of the first channel layer.

7. The tunnel field-effect transistor of claim 6, wherein the material composition of the first portion has a higher tunnel barrier than the material composition of the second portion.

8. The tunnel field-effect transistor of claim 6, wherein the second portion is at a same level as the first portion.

9. The tunnel field-effect transistor of claim 1, further comprising a second gate structure adjacent to a second sidewall of the second channel layer, the second sidewall being different from the first sidewall.

10. The tunnel field-effect transistor of claim 9, wherein the second gate structure is adjacent to a sidewall of the first channel layer and contacts the source layer.

11. The tunnel field-effect transistor of claim 9, wherein the second gate structure is positioned over a third portion of the first channel layer, the third portion being separated from the first portion by the second portion.

12. The tunnel field-effect transistor of claim 1, wherein the first channel layer includes $In_xGa_{1-x}As$ and the second channel layer includes $In_yGa_{1-y}As$ and $x > y$.

13. The tunnel field-effect transistor of claim 1, further comprising a third channel layer positioned over a third portion of the first channel layer and comprising a second drain layer over the third channel layer, the third portion being separated from the first portion by the second portion.

14. The tunnel field-effect transistor of claim 13, wherein the first gate structure is adjacent to a sidewall of the third channel layer.

15. The tunnel field-effect transistor of claim 1, wherein the first channel layer and the second channel layer are one of intrinsic or intrinsically doped.

\* \* \* \* \*